(12) United States Patent
Lee et al.

(10) Patent No.: US 8,133,640 B2
(45) Date of Patent: Mar. 13, 2012

(54) APPARATUS AND METHOD FOR MOUNTING PELLICLE

(75) Inventors: Sang-hee Lee, Yongin-si (KR); Jin Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 861 days.

(21) Appl. No.: 12/230,473

(22) Filed: Aug. 29, 2008

(65) Prior Publication Data

US 2009/0073415 A1 Mar. 19, 2009

(30) Foreign Application Priority Data

Aug. 29, 2007 (KR) .................. 10-2007-0087281

(51) Int. Cl.
*G03F 1/00* (2006.01)
*G03B 27/62* (2006.01)

(52) U.S. Cl. ............................................. 430/5; 355/75

(58) Field of Classification Search ........ 430/5; 428/14; 355/75; 73/768
See application file for complete search history.

(56) References Cited

U.S. PATENT DOCUMENTS

| 6,834,549 B2 * | 12/2004 | Shu et al. ................ 73/768 |
| 2005/0157288 A1 * | 7/2005 | Van Peski et al. ........ 355/75 |

FOREIGN PATENT DOCUMENTS

| JP | 05-088358 | 4/1993 |
| JP | 2005-062634 | 3/2005 |
| KR | 10 2003-0002368 | 1/2003 |

* cited by examiner

*Primary Examiner* — Stephen Rosasco
(74) *Attorney, Agent, or Firm* — Harness, Dickey & Pierce, P.L.C.

(57) ABSTRACT

An apparatus and a method for mounting a pellicle includes a pellicle compression plate formed to apply a plurality of particular pressures to a plurality of points or areas of a region of the reticle where a pellicle frame of the pellicle contacts a reticle.

20 Claims, 7 Drawing Sheets

|   | 3σ    | max  | min   |
|---|-------|------|-------|
| x | 8.66  | 6.30 | -8.00 |
| y | 9.63  | 8.89 | -8.41 |

(unit:nm)

|   | 3σ    | max  | min   |
|---|-------|------|-------|
| x | 9.50  | 7.15 | -9.09 |
| y | 10.25 | 9.96 | -8.18 |

(unit:nm)

|   | 3σ | max | min |
|---|---|---|---|
| x | 4.56 | 3.35 | -3.84 |
| y | 4.09 | 3.75 | -3.48 |

(unit:nm)

APPARATUS AND METHOD FOR MOUNTING PELLICLE

PRIORITY STATEMENT

This application claims the benefit of Korean Patent Application No. 10-2007-0087281, filed on Aug. 29, 2007, in the Korean Intellectual Property Office, the disclosure of which is incorporated herein in its entirety by reference.

BACKGROUND

1. Field

Example embodiments relate to an apparatus and a method for mounting a pellicle.

2. Description of the Related Art

A pellicle is a protective layer or film designed to protect patterns formed on a reticle.

FIG. 1 is a cross-sectional view of an apparatus for mounting a pellicle according to a conventional method. FIG. 2 is a photographic image of the apparatus for mounting a pellicle illustrated in FIG. 1, according to a conventional method.

Referring to FIGS. 1 and 2, the apparatus for mounting a pellicle includes a supporting plate 15, a pellicle compression plate 11, and a reticle 14, on which a desired and/or predetermined pattern is formed. A pellicle, including a pellicle frame 12 and a pellicle film 13, is positioned on the surface of the reticle 14 facing towards the pellicle compression plate 11. The desired and/or predetermined pattern formed on the reticle 14 may be a light blocking film pattern or a phase shift film pattern. The reticle 14 may be formed of quartz and transmit a light during manufacturing a semiconductor device. The pellicle compression plate 11 disposed on the pellicle frame 12 may apply a uniform pressure F to the pellicle frame 12 to mount the pellicle frame 12 on the reticle 14.

Registration and flatness of the reticle 14 may be distorted due to the pressure F applied during the pellicle mounting process.

SUMMARY

Example embodiments provide an apparatus and method for mounting a pellicle that may reduce and/or prevent registration of a reticle from being distorted and improve flatness of the reticle.

According to example embodiments, there is provided an apparatus for mounting a pellicle that may include a pellicle compression plate configured to apply a plurality of pressures to a plurality of points and/or areas where a pellicle frame of the pellicle contacts a reticle.

The apparatus may also include a flatness measuring apparatus configured to measure flatness of the reticle.

The pellicle compression plate may be configured to apply the plurality of pressures based on measurements of the flatness measuring apparatus.

The flatness measuring apparatus may be configured to provide a flatness map of the reticle obtained by measuring the flatness of the reticle before the pellicle is mounted on the reticle.

The flatness apparatus may be configured to provide a flatness map of the reticle obtained by measuring the flatness of the reticle after the pellicle is mounted on the reticle.

The pellicle compression plate may be configured to apply the plurality of pressures according to a registration map of the reticle.

At least one of the plurality of pressures may be an adjusting pressure to compensate for and improve a characteristic of the reticle. The characteristic may be flatness and/or registration of the reticle.

The registration map of the reticle may be obtained by measuring the registration of the reticle before the pellicle is mounted on the reticle.

The registration map of the reticle may be obtained by measuring the registration of the reticle after the pellicle is mounted on the reticle.

The reticle may include a photo mask formed of quartz.

The apparatus may also include a flatness measuring apparatus measuring flatness of the reticle; and the pellicle compression plate may further be configured to apply an attaching pressure to the pellicle frame over a region of the reticle where the pellicle frame contacts the reticle according to a pressure condition calculated according to a flatness map of the reticle measured by the flatness measuring apparatus.

The attaching pressure may of continuously varying values or discontinuously varying values over the region of the reticle where the pellicle frame contacts the reticle.

According to example embodiments, there is provided a method of mounting a pellicle that may include generating a map of a reticle by measuring a characteristic of the reticle; and applying a plurality of pressures to a plurality of points and/or areas of the reticle where the pellicle frame contacts the reticle according the generated map of the reticle.

The characteristic of the reticle may be flatness and/or registration.

The method may also include mounting the pellicle on the reticle.

The method may also include mounting the pellicle on the reticle before generating a map of a reticle by measuring a characteristic of the reticle.

BRIEF DESCRIPTION OF THE DRAWINGS

The above and other features and advantages of example embodiments will become more apparent by describing in detail example embodiments thereof with reference to the attached drawings in which:

FIG. 6 is a partial perspective view illustrating a plurality of particular pressures distributed on a region of a reticle surface where a pellicle is mounted on.

DETAILED DESCRIPTION OF EXAMPLE EMBODIMENTS

Figure 1:
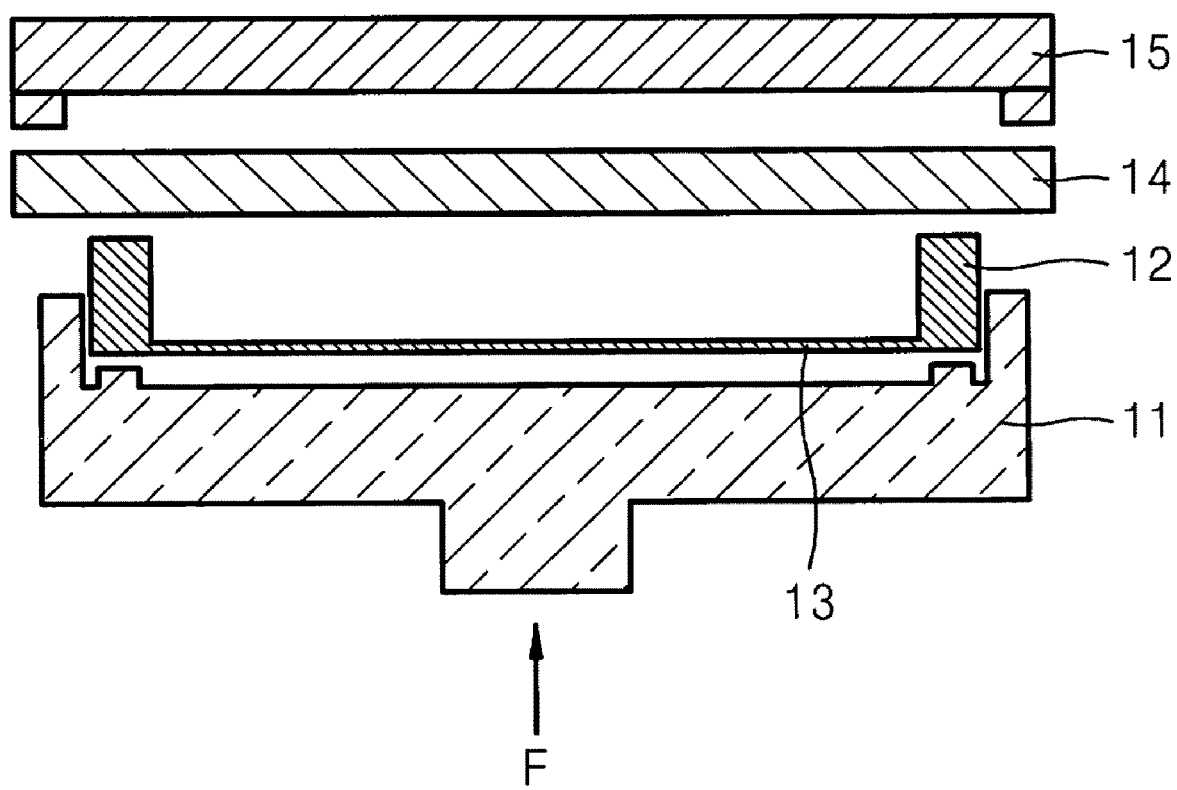
FIG. 1 is a cross-sectional view of an apparatus for mounting a pellicle according to a conventional method.
Figure 2:
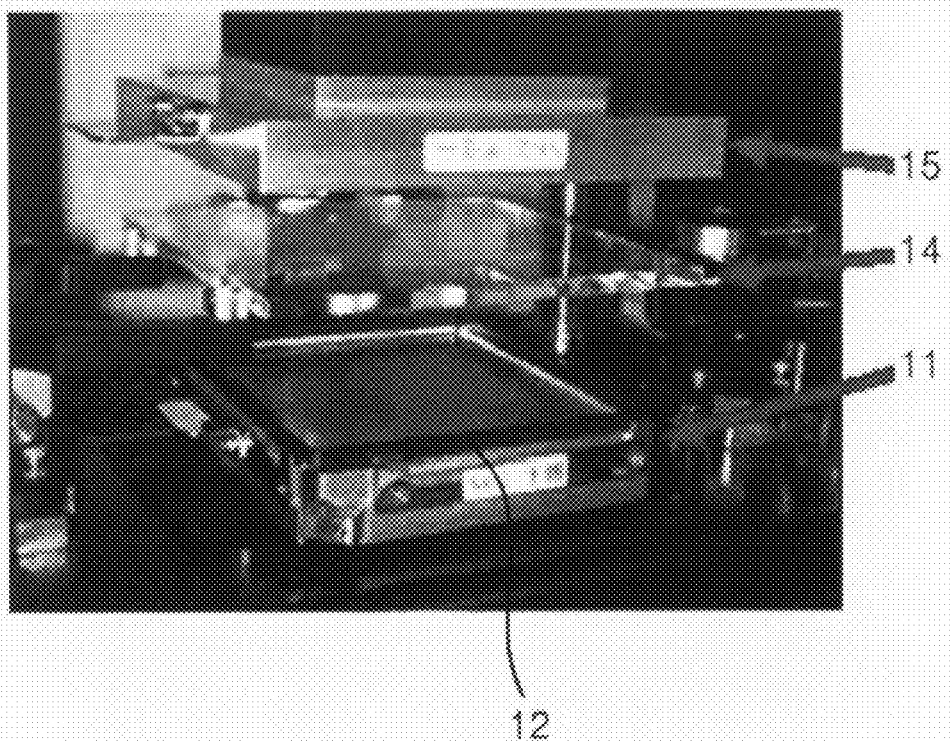
FIG. 2 is a photographic image of an apparatus for mounting a pellicle according to a conventional method.

Example embodiments will now be described more fully with reference to the accompanying drawings, in which example embodiments are shown. Example embodiments may, however, be embodied in many different forms, and should not be construed as being limited to the embodiments set forth herein; rather, example embodiments are provided so that this disclosure will be thorough and complete, and will fully convey the concept of the application to one skilled in the art.

In the drawings, the thicknesses of layers and regions are exaggerated for clarity. Like reference numerals denote like elements throughout the specification and drawings.

Throughout the specification, it will also be understood that when an element such as layer, region, or substrate is referred to as being "on" another element, it may be directly on the other element, or intervening elements may also be present. In addition, relative terms such as "lower" or "bottom", and "upper" or "top" may be used herein to describe one element's relationship to another as illustrated in the drawings. It will be understood that relative terms are intended to encompass different orientations of the device in addition to the orientation depicted in the drawings. For example, if a device in the drawings is inverted, elements described as being on the "lower" side of other elements would then be oriented on "upper" sides of the other elements. The exemplary term "lower", may therefore, encompasses both an orientation of "lower" and "upper", depending on the particular orientation of the figure. Similarly, if a device in one of the drawings is inverted, elements described as "below" or "beneath" other elements would then be oriented "above" the other elements. The exemplary terms "below" or "beneath" may, therefore, encompass both an orientation of above and below.

Figure 3A:
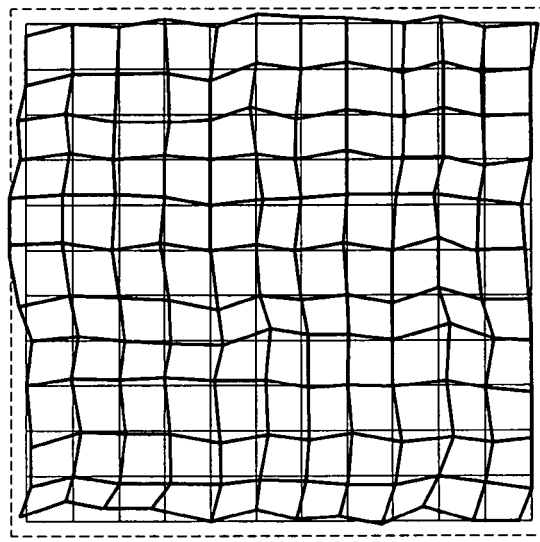
FIG. 3A illustrates a registration map of a reticle before mounting a pellicle to the reticle.
Figure 3B:
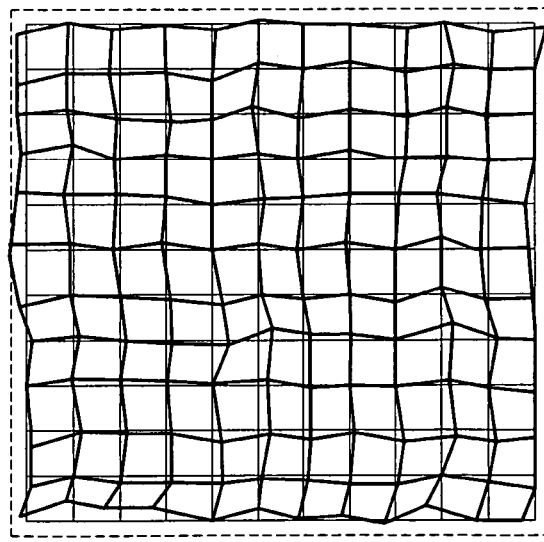
FIG. 3B illustrates a registration map of a reticle after attaching a pellicle to the reticle.
Figure 3C:
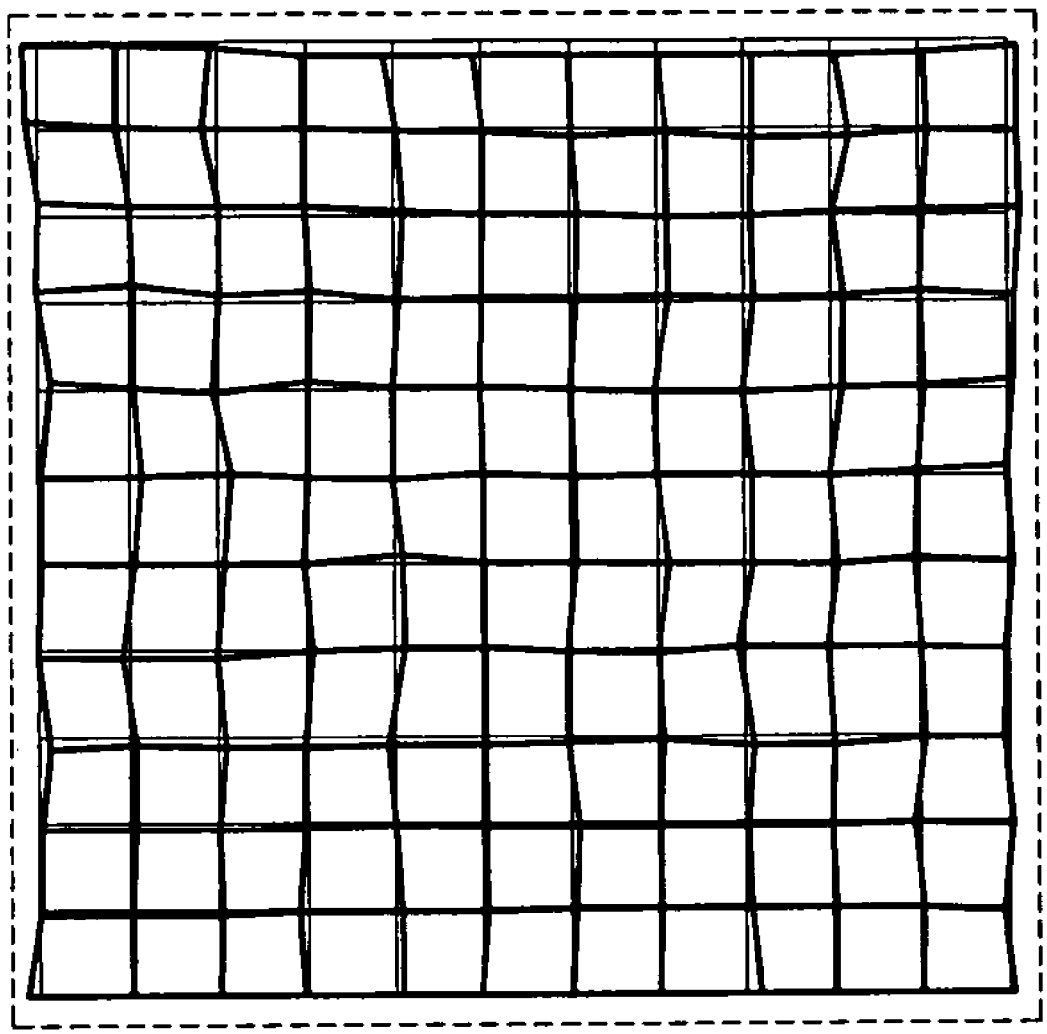
FIG. 3C illustrates the accuracy of the registration of a reticle is improved according to example embodiments of an apparatus and method for mounting a pellicle.

FIG. 3A illustrates a registration map of a reticle before mounting a pellicle on the reticle, FIG. 3B illustrates a registration map of a reticle after mounting a pellicle on the reticle, and FIG. 3C is illustrate an improved registration of a reticle according to example embodiments. In FIGS. 3A-3C, the light, solid line meshes may be examples of ideal mask patterns drawn to a reticle, and the dark, solid line meshes may refer to actual mask patterns on the reticle.

Referring to FIG. 3A, before the pellicle is mounted on the reticle, statistical registration values of the reticle (3σ) are 8.66 nm in the x-direction and 9.63 nm in the y-direction.

Referring to FIG. 3B, after the pellicle is mounted on the reticle, statistical registration values of the reticle (3σ) are 9.50 nm in the x-direction and 10.25 nm in the y-direction.

Accordingly, the registration of the reticle varies during the process of mounting the pellicle on the reticle. The variation of the registration of the reticle may be caused by variation in flatness of the reticle due to a pressure applied during the process of mounting the pellicle on the reticle.

Referring to FIG. 3C, variation of the registration of the reticle generated during the process of mounting the pellicle on the reticle are statistically (3σ) 4.56 nm in the x-direction and 4.09 nm in the y-direction. Accordingly, example embodiments reduce and/or minimize varying quantities (see FIG. 3C) of the registration of the reticle generated during the process of mounting the pellicle on the reticle, and reduce distortion (see FIG. 3A) of the registration of the reticle generated before the pellicle is mounted on the reticle.

Figure 4A:
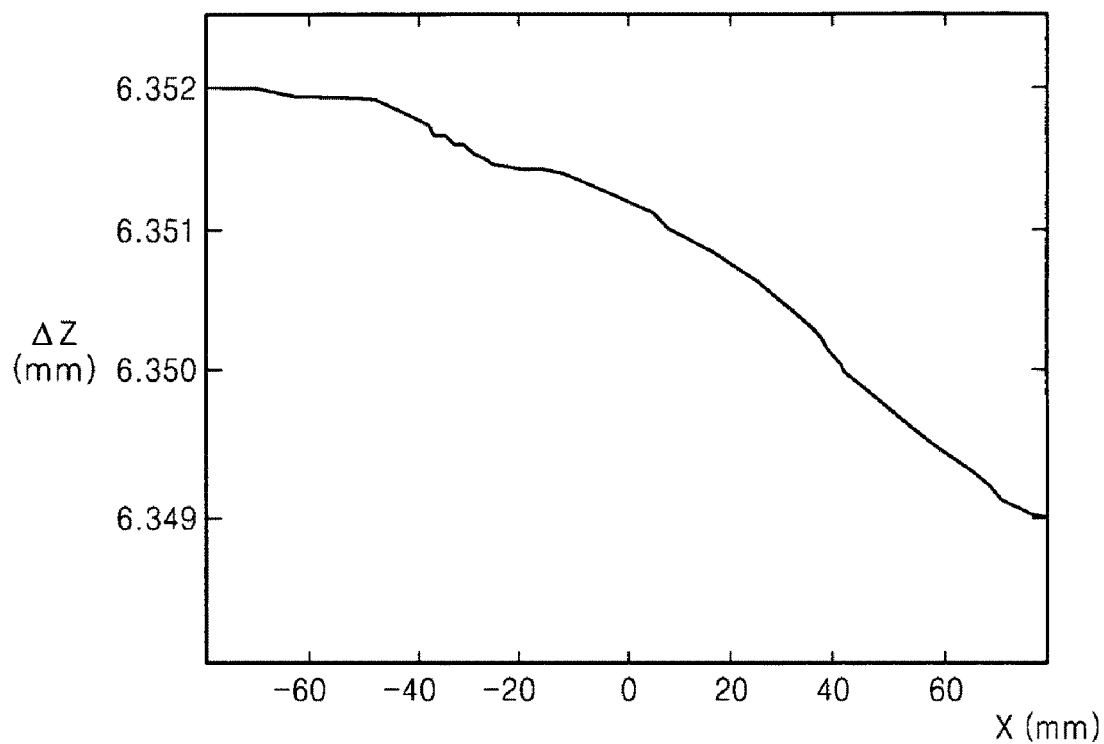
FIG. 4A is a graph illustrating measurement of flatness of a reticle along a line on a surface of the reticle.
Figure 4B:
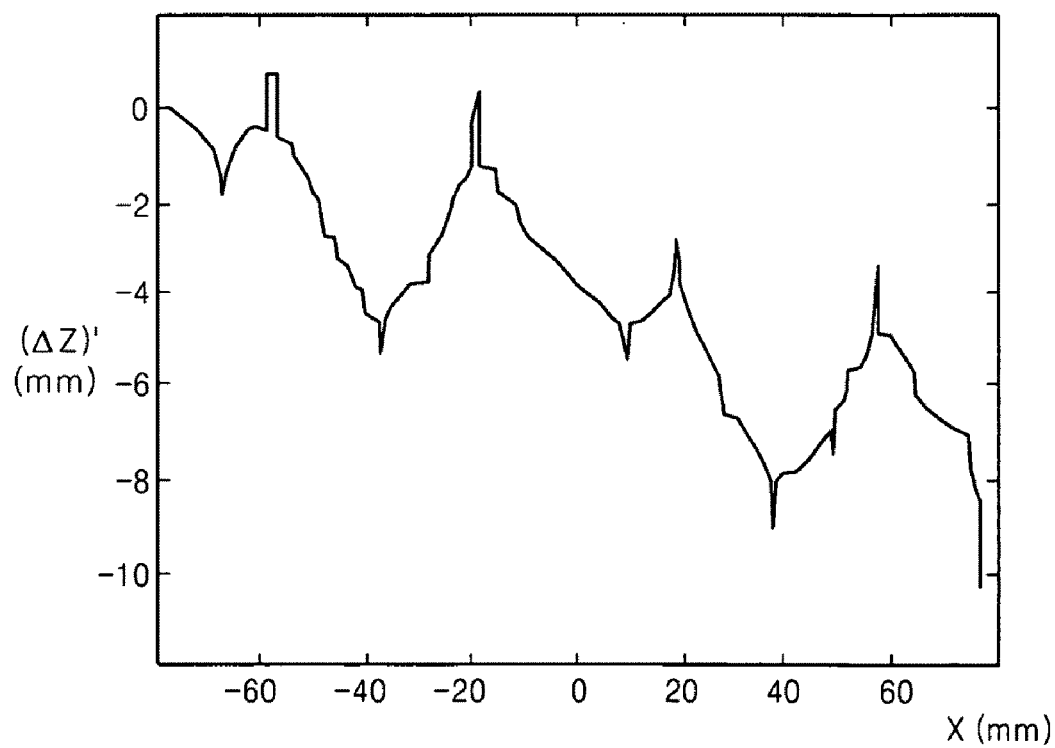
FIG. 4B is a graph illustrating a primary differential value of the flatness of the reticle of FIG. 4A.

FIG. 4A is a graph illustrating measurement of flatness of a reticle along a line on a surface of the reticle; FIG. 4B is a graph illustrating calculation of a primary differential value of flatness of the reticle of FIG. 4A; and FIG. 4C is a graph illustrating measurement of registration of a reticle along a line on the surface of the reticle, according to example embodiments.

Referring to FIG. 4A, the flatness (Δz) of the reticle along the x-axis of the reticle is measured. The horizontal axis denotes a line on a surface of the reticle, and the vertical axis denotes the height of the reticle surface along the line compared to a reference height value. As one may see from FIG. 4A, the flatness of the reticle decreases along the positive direction of the x-axis.

FIG. 4B illustrates the primary differential value of the flatness (Δz') of the reticle illustrated in FIG. 4A. For example, the primary differential value of flatness may be a gradient value of the flatness of the reticle surface along a line in the x direction.

Figure 4C:
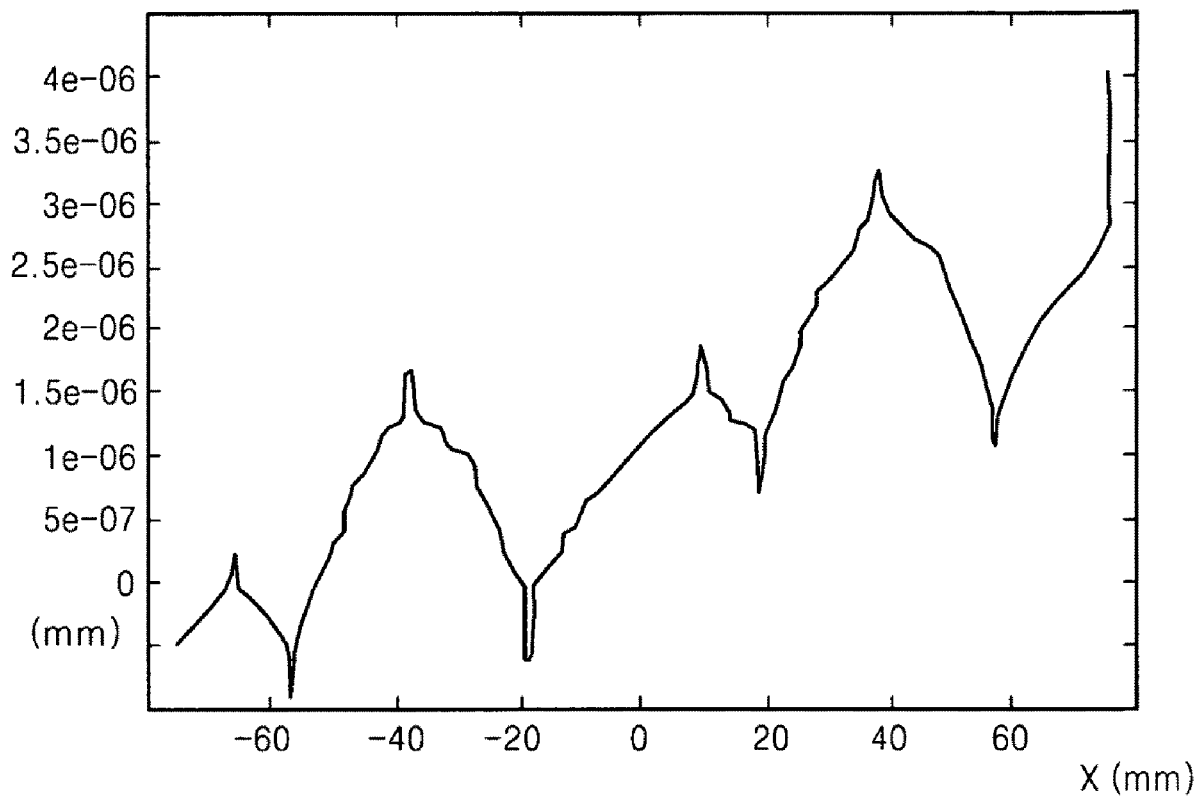
FIG. 4C is a graph illustrating measurement of registration of a reticle according to example embodiments of an apparatus and method for mounting a pellicle.

Referring to FIG. 4C, the vertical axis denotes the measured registration values of a reticle, and the horizontal axis denotes the line on the reticle. As one may see from FIG. 4C, compared to FIG. 4B, the registration values of the reticle along the x-axis in FIG. 4C resemble the pattern appearing in FIG. 4B.

The above result shows that the improvement of the flatness of the reticle significantly improves the registration accuracy of the reticle. Next, example embodiments will be described more fully with reference to the accompanying drawings FIGS. 5 and 6.

Figure 5:
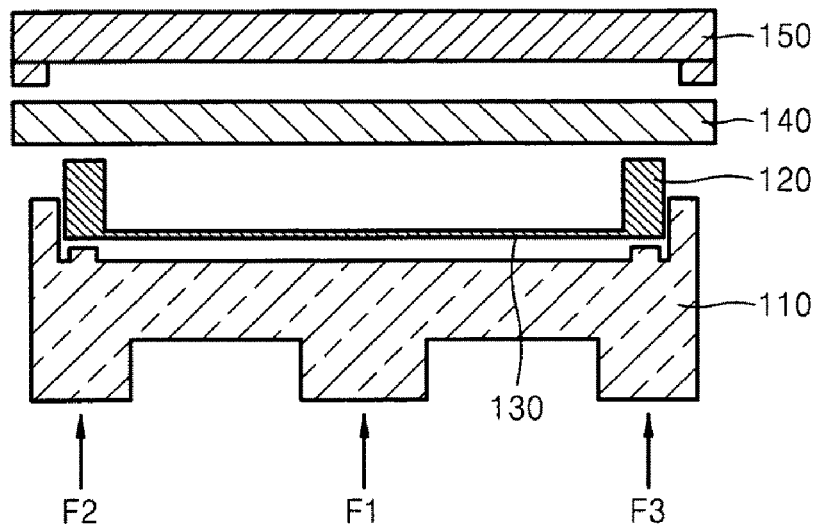
FIG. 5 is a cross-sectional view illustrating an apparatus for mounting a pellicle according to example embodiments.
Figure 6:
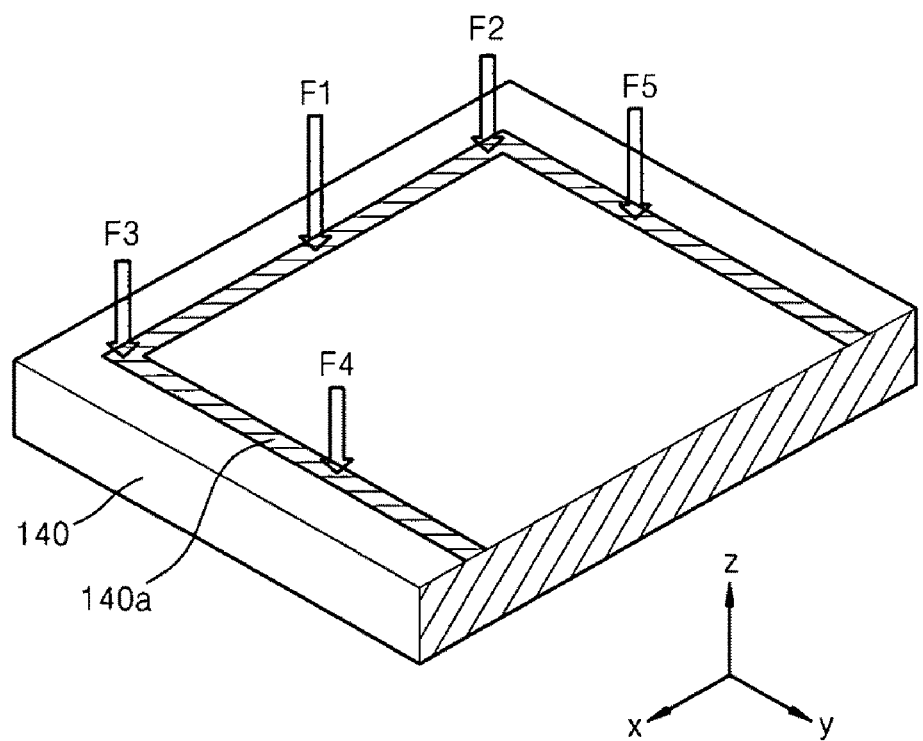

FIG. 5 is a cross-sectional view illustrating an apparatus for mounting a pellicle according to example embodiments. FIG. 6 is a partial perspective view illustrating a plurality of particular pressures distributed on a region of a reticle surface where a pellicle is mounted.

Referring to FIG. 5, the apparatus for mounting a pellicle may include a supporting plate 150, a pellicle compression plate 110, and a reticle 140, on which a desired and/or predetermined pattern may be formed. A pellicle, including a pellicle frame 120 and a pellicle film 130, may be appropriately positioned on the surface of the reticle 140 facing towards the pellicle compression plate 110. To mount the pellicle on the reticle 140, the pellicle compression plate 110 may be formed so as to apply an attaching pressure to the pellicle frame 120 against the reticle 140. The pressure may be transmitted by the reticle 140 and be exerted on the supporting plate 150. The reticle 140 may be a photo mask formed of quartz, and the desired and/or predetermined pattern may be a light blocking film pattern or a phase shift film pattern formed on the reticle 140.

Referring to FIG. 6, the pellicle compression plate 110 may be formed so that a plurality of particular pressures F1, F2, F3, F4, and F5 may be applied to a plurality of points and/or areas of a region 140a, respectively. The region 140a is a portion of the surface of reticle 140 where the pellicle frame 120 contacts. The particular pressures are not limited to the five points and/or areas illustrated in FIG. 6, and an appropriate number of particular pressures may be applied to the pellicle frame 120. Also, the particular pressures may have various values.

According to an example embodiment, an apparatus for mounting the pellicle may further include a flatness measuring apparatus (not shown) measuring the flatness of the reticle 140, and a flatness map may be obtained by measuring the flatness of the reticle 140 before the pellicle frame 120 is mounted on the reticle 140. The particular pressures may include an adjusting pressure that may compensate for and improve flatness of the reticle 140 according to the flatness map of the reticle 140. When the pellicle is mounted on the reticle 140, the adjusting pressure may be applied to the reticle 140 to compensate for and improve the flatness of the reticle 140. For example, in a region of the reticle 140 that has a worse flatness, the adjusting pressure may be greater or less than the particular pressures applied to other regions of the reticle 140, resulting in an improvement of the flatness of the region. In addition, the flatness map of the reticle 140 may also be measured after the pellicle frame 120 is mounted on the reticle 140. By applying the adjusting pressure to the mounted pellicle frame 120 again, flatness of the reticle 140 may be compensated for and/or improved. For example, in a region of the reticle 140 that has a worse flatness, the adjusting pressure may be greater or less than the pressures applied to other regions of the reticle 140, resulting in an improvement of the flatness of the region.

According to an example embodiment, the particular pressures may include an adjusting pressure that may compensate for and/or improve registration of the reticle 140 according to a registration map of the reticle 140. The registration map of the reticle may be obtained by measuring registration of the reticle 140 before the pellicle frame 120 is mounted on the reticle 140. When the pellicle is mounted on the reticle 140, the adjusting pressure may be applied to the reticle 140 to compensate for and improve the registration of reticle 140. For example, in a region of the reticle 140 having worse registration, the adjusting pressure may be greater or less than the particular pressures applied to other regions, resulting in an improvement of the registration of the region. In addition, the registration map of the reticle 140 may be measured after the pellicle frame 120 is mounted on the reticle 140. By applying the adjusting pressure to the mounted pellicle frame 120 again, the registration of the reticle 140 may be compensated for and/or improved. For example, in a region of the reticle 140 having worse registration, the adjusting pressure may be greater or less than the particular pressures applied to other regions of the reticle 140, resulting in an improvement of the registration of the region.

Accordingly, in an apparatus and method for mounting pellicle according to example embodiments illustrated in FIGS. 5 and 6, the apparatus may include a supporting plate 150, a pellicle compression plate 110. A reticle 140 may be interposed between the supporting plate 150 and the pellicle compression plate 110. A pellicle, including a pellicle frame 120 and a pellicle film 130, may be appropriately positioned on a surface of the reticle facing towards the pellicle compression plate. The pellicle compression plate 110 may apply a plurality of particular pressures to the pellicle frame 120 to mount the pellicle on the reticle 140. The plurality of particular pressures may be distributed discretely and applied separately to a plurality of points and/or areas of a region 140*a* on the surface of the reticle, where the pellicle frame 120 contacts. The plurality of particular pressures may include an adjusting pressure, which is used to compensate for and improve a characteristic of the reticle according to a map of the characteristic of the reticle obtained before and/or after the pellicle is mounted on the reticle. The characteristic may be flatness and/or registration of the reticle.

However, example embodiments are not limited thereto. For example, the attaching pressure may be applied by the supporting plate 150, and/or the applied pressures may have values continuously distributed over the region 140*a*. For example, the applied pressures may be continuously adjusted over the region 140*a* according to pressure conditions for mounting the pellicle calculated using the flatness map and/or the registration map of the reticle 140. The calculated pressure conditions for mounting the pellicle may compensate for and/or improve the flatness map and/or the registration map of the reticle 140.

The apparatus and method for mounting a pellicle according to the present invention may be used to improve and/or prevent distortions in registration and improve flatness of a reticle. While example embodiments have been particularly shown and described, it will be understood by one of ordinary skill in the art that various changes in form and details may be made therein without departing from the spirit and scope of the present invention as defined by the following claims.

What is claimed is:

1. An apparatus, comprising:
a pellicle compression plate configured to apply a plurality of pressures to a plurality of areas where a pellicle frame of a pellicle contacts a reticle,
wherein the plurality of pressures includes an adjusting pressure that is greater or smaller than the other plurality of pressures.

2. The apparatus of claim 1, further comprising:
a flatness measuring apparatus configured to measure flatness of the reticle.

3. The apparatus of claim 2, wherein the pellicle compression plate is configured to apply the plurality of pressures based on measurements of the flatness measuring apparatus.

4. The apparatus of claim 3, wherein the flatness measuring apparatus is configured to provide a flatness map of the reticle obtained by measuring the flatness of the reticle before the pellicle is mounted on the reticle.

5. The apparatus of claim 3, wherein the flatness measuring apparatus is configured to provide a flatness map of the reticle obtained by measuring the flatness of the reticle after the pellicle is mounted on the reticle.

6. The apparatus of claim 1, wherein the pellicle compression plate is configured to apply the plurality of pressures according to a registration map of the reticle.

7. The apparatus of claim 1, wherein the adjusting pressure compensates for and improves a characteristic of the reticle, wherein the characteristic is one of flatness and registration of the reticle.

8. The apparatus of claim 6, wherein the registration map of the reticle is obtained by measuring the registration of the reticle before the pellicle is mounted on the reticle.

9. The apparatus of claim 6, wherein the registration map of the reticle is obtained by measuring the registration of the reticle after the pellicle is mounted on the reticle.

10. The apparatus of claim 1, wherein the reticle includes a photo mask formed of quartz.

11. The apparatus of claim 1, further comprising: a flatness measuring apparatus measuring flatness of the reticle; and the pellicle compression plate is further configured to apply an attaching pressure to the pellicle frame over a region of the reticle where the pellicle frame contacts the reticle according to a pressure condition calculated according to a flatness map of the reticle measured by the flatness measuring apparatus.

12. The apparatus of claim 11, wherein the attaching pressure has one of continuously varying values and discontinuously varying values over the region of the reticle where the pellicle frame contacts the reticle.

13. The apparatus of claim 1, further comprising:
a supporting plate,
wherein the pellicle is between the supporting plate and the pellicle compression plate.

14. The apparatus of claim 13, wherein
the pellicle includes a pellicle film in a boundary of the pellicle frame;
the pellicle film is spaced apart from the reticle by the pellicle frame; and
the pellicle compression plate includes a recess for accommodating the pellicle.

15. A method of mounting a pellicle having a pellicle frame, the method comprising:
generating a map of a reticle by measuring a characteristic of the reticle; and applying a plurality of pressures to a plurality of areas of the reticle where the pellicle frame contacts the reticle, according to the generated map of the reticle,
wherein the plurality of pressures includes an adjusting pressure that is greater or smaller than the other plurality of pressures.

16. The method of claim 15, wherein the characteristic of the reticle is one of flatness and registration.

17. The method of claim 15, further comprising:
mounting the pellicle on the reticle.

18. The method of claim 15, further comprising:
mounting the pellicle on the reticle before generating a map of a reticle by measuring a characteristic of the reticle.

19. The method of claim 15, further comprising:
inserting the reticle between a supporting plate and the pellicle frame.

20. The method of claim 15, wherein
the pellicle includes a pellicle film, and
the applying a plurality of pressures to a plurality of areas of the reticle where the pellicle frame contacts the reticle includes,
positioning the pellicle including the pellicle film and the pellicle frame against a surface of the reticle, and
applying an attaching pressure to the pellicle frame using a pellicle compression plate,
the pellicle compression plate being configured to transmit to the pellicle frame the plurality of pressures to the plurality of areas of the reticle where the pellicle frame contacts the reticle.

* * * * *